United States Patent
Ahn et al.

(10) Patent No.: US 11,749,185 B2
(45) Date of Patent: *Sep. 5, 2023

(54) DISPLAY DEVICE

(71) Applicant: Samsung Display Co., Ltd., Yongin-si (KR)

(72) Inventors: Seongsik Ahn, Yongin-si (KR); Gyunsoo Kim, Daejeon (KR); Minki Kim, Hwaseong-si (KR); Jeongjin Kim, Cheonan-si (KR); Soon-Sung Park, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 325 days.

This patent is subject to a terminal disclaimer.

(21) Appl. No.: 17/022,103

(22) Filed: Sep. 16, 2020

(65) Prior Publication Data
US 2021/0005132 A1  Jan. 7, 2021

Related U.S. Application Data

(63) Continuation of application No. 15/959,285, filed on Apr. 23, 2018, now Pat. No. 10,796,633.

(30) Foreign Application Priority Data

Jul. 12, 2017 (KR) .................. 10-2017-0088677

(51) Int. Cl.
G09G 3/3208 (2016.01)
H10K 30/80 (2023.01)
(Continued)

(52) U.S. Cl.
CPC ..... G09G 3/3208 (2013.01); G02F 1/133528 (2013.01); H10K 30/865 (2023.02);
(Continued)

(58) Field of Classification Search
CPC ............ G09G 3/3208; G02F 1/133528; G02F 1/3505; H01L 27/3209; H01L 27/32;
(Continued)

(56) References Cited

U.S. PATENT DOCUMENTS 3,723,261 A    3/1973 Byers et al.
8,482,713 B2*  7/2013 Qi ...................... B23K 26/38
                                      219/121.61
(Continued)

FOREIGN PATENT DOCUMENTS

CN    101847651    9/2010
CN    103548135    1/2014
(Continued)

OTHER PUBLICATIONS

Extended European Search Report dated Nov. 21, 2018, issued in European Patent Application No. 18182590.2.
(Continued)

Primary Examiner — Dale E Page
Assistant Examiner — Quovaunda Jefferson
(74) Attorney, Agent, or Firm — H.C. Park & Associates, PLC

(57) ABSTRACT

A display device including a display panel, in which a display region including a plurality of organic light emitting devices and a non-display region adjacent to the display region are defined, a protection film disposed below the display panel, a first adhesive layer contacting a bottom surface of the protection film, a supporting layer comprising a metallic material, at least overlapping the entire display region, and contacting the first adhesive layer, an input-sensing unit disposed on the display panel, an anti-reflection unit disposed on the input-sensing unit, and a window panel disposed on the input-sensing unit.

12 Claims, 16 Drawing Sheets

(51) Int. Cl.
| | |
|---|---|
| *H10K 50/87* | (2023.01) |
| *H10K 50/844* | (2023.01) |
| *H10K 50/86* | (2023.01) |
| *H10K 50/842* | (2023.01) |
| *H10K 59/32* | (2023.01) |
| *H10K 59/40* | (2023.01) |
| *H10K 77/10* | (2023.01) |
| *G02F 1/1335* | (2006.01) |
| *G02F 1/35* | (2006.01) |
| *H10K 59/12* | (2023.01) |

(52) U.S. Cl.
CPC ....... *H10K 50/844* (2023.02); *H10K 50/8426* (2023.02); *H10K 50/865* (2023.02); *H10K 50/87* (2023.02); *H10K 59/32* (2023.02); *H10K 59/40* (2023.02); *H10K 77/10* (2023.02); *G02F 1/3505* (2021.01); *H10K 50/86* (2023.02); *H10K 59/12* (2023.02)

(58) Field of Classification Search
CPC ............... H01L 27/323; H01L 27/3244; H01L 51/0096; H01L 51/5008; H01L 51/52; H01L 51/5246; H01L 51/5253; H01L 51/5284; H01L 51/529; H01L 51/5281; H01L 51/56
See application file for complete search history.

(56) References Cited

U.S. PATENT DOCUMENTS

| | | |
|---|---|---|
| 8,629,964 B2 | 1/2014 | Kim |
| 9,202,855 B1 | 12/2015 | Jo et al. |
| 9,287,329 B1 | 3/2016 | Lee et al. |
| 9,763,368 B2 | 9/2017 | Park et al. |
| 9,958,718 B2 | 5/2018 | Shin et al. |
| 2003/0071938 A1 | 4/2003 | Hamamoto et al. |
| 2007/0159078 A1 | 7/2007 | Park et al. |
| 2010/0244005 A1 | 9/2010 | Gyoda |
| 2012/0181914 A1 | 7/2012 | Fukuda et al. |
| 2014/0044915 A1 | 2/2014 | Niwa et al. |
| 2014/0085830 A1 | 3/2014 | Fukuda et al. |
| 2015/0021570 A1 | 1/2015 | Kim et al. |
| 2015/0036300 A1 | 2/2015 | Park et al. |
| 2015/0340640 A1 | 11/2015 | Kang et al. |
| 2016/0027718 A1 | 1/2016 | Park et al. |
| 2017/0162823 A1 | 6/2017 | Kim et al. |
| 2018/0204885 A1 | 7/2018 | Chiang et al. |

FOREIGN PATENT DOCUMENTS

| | | |
|---|---|---|
| CN | 104347678 | 2/2015 |
| CN | 105098089 | 11/2015 |
| CN | 105374844 | 3/2016 |
| CN | 106353904 | 1/2017 |
| CN | 106598347 | 4/2017 |
| CN | 106847086 | 6/2017 |
| EP | 2947708 | 11/2015 |
| KR | 10-2007-0067909 | 6/2007 |
| KR | 10-1009645 | 1/2011 |
| KR | 10-1082284 | 11/2011 |
| KR | 10-2016-0095696 | 8/2016 |

OTHER PUBLICATIONS

Non-Final Office Action dated Feb. 8, 2019, issued to U.S. Appl. No. 15/959,285.

Non-Final Office Action dated Aug. 22, 2019, issued to U.S. Appl. No. 15/959,285.

Final Office Action dated Mar. 3, 2020, issued to U.S. Appl. No. 15/959,285.

Notice of Allowance dated May 29, 2020, issued to U.S. Appl. No. 15/959,285.

* cited by examiner

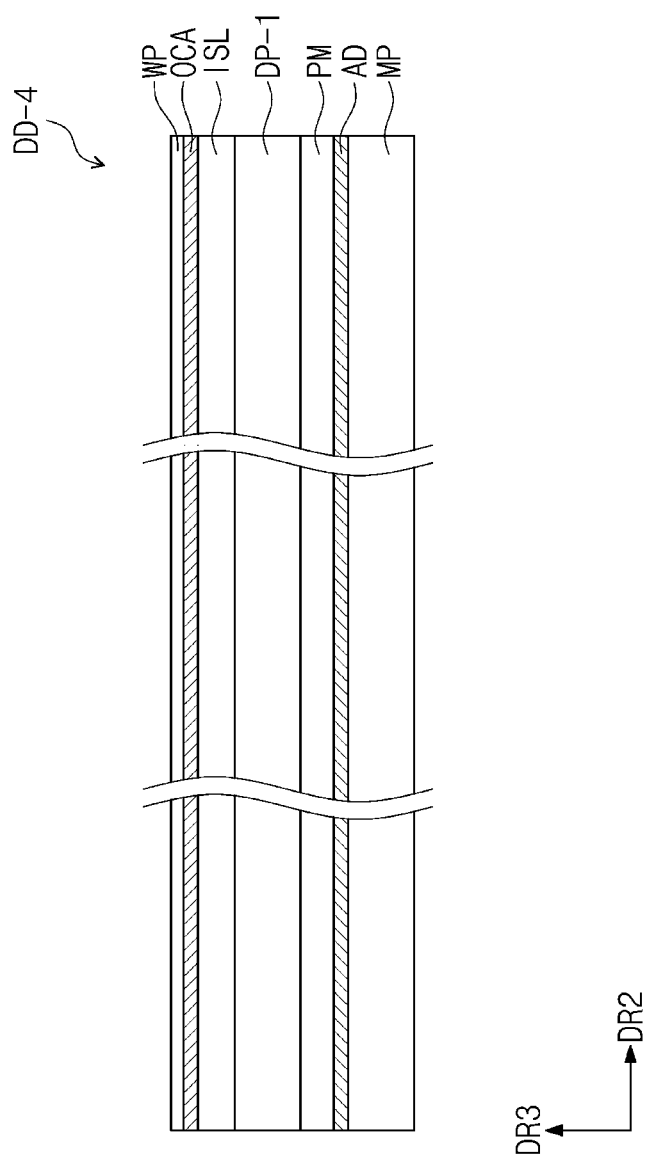

DISPLAY DEVICE

CROSS-REFERENCE TO RELATED APPLICATION

This application is a Continuation of U.S. patent application Ser. No. 15/959,285, filed on Apr. 23, 2018, which claims priority from and the benefit of Korean Patent Application No. 10-2017-0088677, filed on Jul. 12, 2017, each of which is hereby incorporated by reference for all purposes as if fully set forth herein.

BACKGROUND

Field

Exemplary embodiments relate to a display device with high durability, good heat-dissipation property, and good aesthetic appearance.

Discussion of the Background

Various display apparatuses are being developed and used in multimedia devices, such as televisions, cell phones, tablet computers, navigation systems, gaming machines, and the like.

Some portable display devices, such as cell phones, tablet PCs, or wearable devices, have a risk of being damaged by an external impact during their usage. Furthermore, ineffective dissipation of heat generated from internal components of a display device to the outside may cause injury to a user, such as low temperature burn.

In a typical mode of usage, a display device is in a turned-on state rather than in a turned-off state. Therefore, it is desirable for a display device to provide an excellent display quality in the turn-on state and an excellent aesthetic appearance in the turn-off state.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the invention provide a display device with enhanced durability to an external impact.

Exemplary embodiments of the invention also provide a display device having an excellent heat-dissipation property and an excellent aesthetic appearance.

Additional aspects will be set forth in the detailed description which follows, and, in part, will be apparent from the disclosure, or may be learned by practice of the inventive concept.

According to an exemplary embodiment, a display device includes a display panel, in which a display region including a plurality of organic light emitting devices and a non-display region adjacent to the display region are defined, a protection film disposed below the display panel, a first adhesive layer contacting a bottom surface of the protection film, and a supporting layer including a metallic material, at least overlapping the entire display region, and contacting the first adhesive layer.

The first adhesive layer may include a pressure sensitive adhesive.

The first adhesive layer may have a black color.

The protection film may include a plurality of alignment marks on a bottom portion thereof, and the supporting layer may expose the alignment marks.

The supporting layer may have a recessed region formed in one side thereof in a plan view, and the recessed region may expose the alignment marks.

A width of the supporting layer may be greater than a width of the display panel.

The metallic material may include at least one of stainless steel, aluminum, iron, and copper.

The supporting layer may further include graphite.

The supporting layer may further include a plating layer having a black color and contacting the first adhesive layer.

The plating layer may include nickel (Ni).

The metallic material may include a first metallic material and a second metallic material different from the first metallic material, and the supporting layer may include a first metal layer and a second metal layer comprising the first metallic material and the second metallic material, respectively.

The display device may further include a second adhesive layer disposed between the first metal layer and the second metal layer.

The display device may further include an anti-reflection unit disposed on the display panel, an input-sensing unit disposed on the anti-reflection unit, and a window panel disposed on the input-sensing unit.

An upward direction, a downward direction, a leftward direction, and a rightward direction may be defined on a plane parallel to the display region, in the rightward direction and the leftward direction, the anti-reflection unit may protrude outwardly from the supporting layer, in the upward direction, the anti-reflection unit may protrude outwardly from the supporting layer, and in the downward direction, the supporting layer may protrude outwardly from the anti-reflection unit.

The display panel may further include a plurality of pads disposed in the downward direction and configured to provide electrical signals to the organic light emitting devices.

The display device may further include a pressure-sensing unit disposed below the supporting layer and configured to sense pressure exerted from an outside.

According to an exemplary embodiment, a display device includes a display panel configured to display an image, an anti-reflection unit disposed on the display panel and configured to suppress reflection of external light incident thereto, a first adhesive layer disposed below the display panel, and a supporting layer having rigidity and directly disposed on the first adhesive layer, in which a portion of the supporting layer overlaps the display panel and does not overlap the anti-reflection unit in a plan view.

The first adhesive layer may include a pressure sensitive adhesive that has a black color.

The display panel may include a plurality of alignment marks disposed on a lower portion thereof, and the supporting layer may have a recessed region exposing the alignment marks.

The supporting layer may include a metallic material or graphite.

The metallic material may include SUS304 or SUS316.

The supporting layer may further include a plating layer having a black color and contacting the adhesive layer.

The plating layer may include nickel.

The supporting layer may include a first metal layer including a first metallic material, and a second metal layer may include a second metallic material different from the first metallic material.

The display device may further include a second adhesive member disposed between the first metal layer and the second metal layer and configured to combine the first metal layer with the second metal layer.

A width of the supporting layer may be greater than a width of the display panel.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 2A, FIG. 2B, FIG. 2C, FIG. 2D, and FIG. 2E are cross-sectional views illustrating display devices according to exemplary embodiments.

DETAILED DESCRIPTION OF THE ILLUSTRATED EMBODIMENTS

Figure 1:
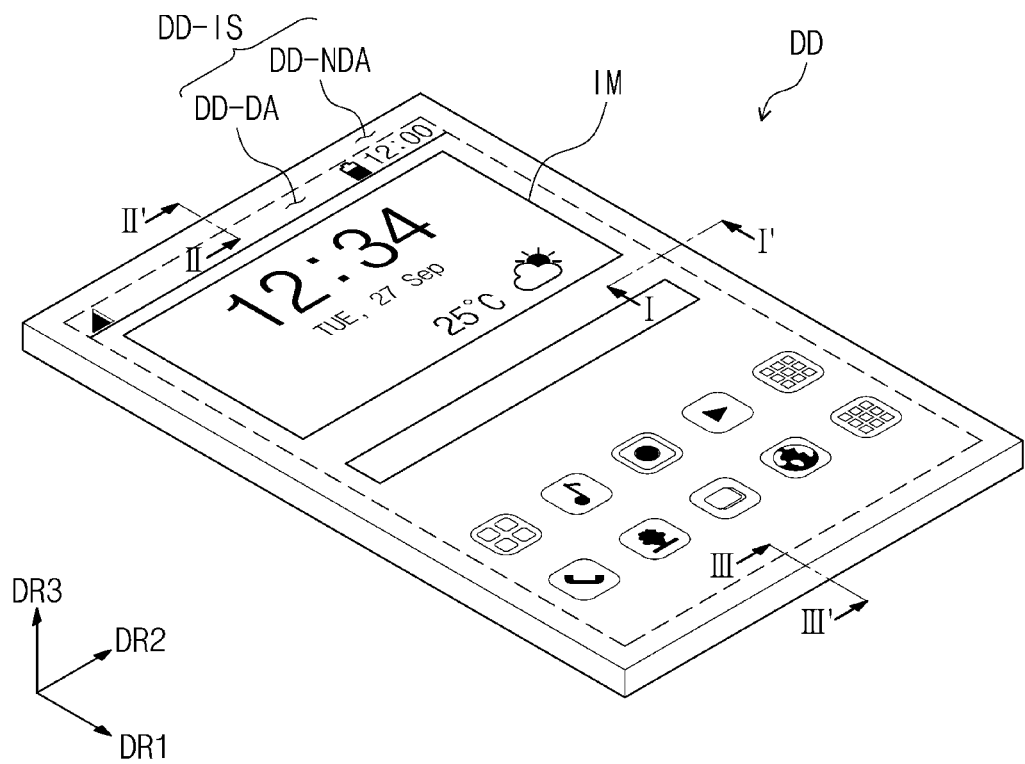
FIG. 1 is a perspective view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view illustrating a display device DD according to an exemplary embodiment. As shown in FIG. 1, the display device DD may include a display surface DD-IS used to display an image IM. The display surface DD-IS may be parallel to a first direction axis DR1 and a second direction axis DR2. A normal direction of the display surface DD-IS (e.g., a thickness direction of the display device DD) will be referred to as a third direction axis DR3.

Hereinafter, the third direction axis DR3 may be used to differentiate a front or top surface of each element from a back or bottom surface. However, directions indicated by the first to third direction axes DR1, DR2, and DR3 may be relative concepts and may not be limited to the above example, and, in some exemplary embodiments, they may be changed to indicate other directions. Hereinafter, first to third directions may be directions indicated by the first to third direction axes DR1, DR2, and DR3, respectively, and will be identified with the same reference numbers.

The display device DD in FIG. 1 is shown as having a flat display surface, but the inventive concepts are not limited thereto. For example, the display surface of the display device DD may have a curved or three-dimensional shape. When the display device DD has the three-dimensional display surface, the display surface may include a plurality of display regions that are oriented in different directions. For example, the display device DD may have a display surface having a polygonal pillar shape.

In the present exemplary embodiment, the display device DD may be a rigid display device. However, the inventive concepts are not limited thereto, and in some embodiments, the display device DD may be a flexible display device. In the present exemplary embodiment, the display device DD may be used as a cellphone terminal. Although not shown, a mainboard mounted with electronic modules, a camera module, a power module, and so forth, along with the display device DD, may be provided in a bracket or a case to provide a cellphone terminal. The display device DD may be used for large-sized electronic devices (e.g., television sets and monitors) or small- or medium-sized electronic devices (e.g., tablets, car navigation systems, game machines, and smart watches).

As shown in FIG. 1, the display surface DD-IS may include a display region DD-DA used to display the image IM, and a non-display region DD-NDA adjacent to the display region DD-DA. The non-display area DD-NDA may not be used to display an image. As an example of the image IM, icon images are shown in FIG. 1.

As shown in FIG. 1, the display region DD-DA may have a rectangular shape. The non-display region DD-NDA may be provided to surround the display region DD-DA. However, the inventive concepts are not limited thereto, and in some exemplary embodiments, shapes of the display and non-display regions DD-DA and DD-NDA may be variously changed as needed.

FIGS. 2A to 2E are cross-sectional views illustrating display devices DD, DD-1, DD-2, DD-3, and DD-4 according to exemplary embodiments. FIGS. 2A to 2E illustrate vertical sections, each of which is taken on a plane defined by the second and third directions DR2 and DR3. In FIGS. 2A to 2E, the display devices DD, DD-1, DD-2, DD-3, and DD-4 are illustrated in a simplified manner in order to describe a stacking structure of a functional panel and/or functional units therein.

In some exemplary embodiments, each of the display devices DD, DD-1, DD-2, DD-3, and DD-4 may include a display panel, an input-sensing unit, an anti-reflection unit, and a window unit. At least two of the display panel, the input-sensing unit, the anti-reflection unit, and the window unit may be successively formed by a successive process or may be combined with each other by an adhesive member. FIGS. 2A to 2E illustrate examples, in which an optically clear adhesive OCA is used as the adhesive member. In various exemplary embodiments described below, the adhesive member may be a typical adhesive material or a gluing agent. In some exemplary embodiments, the anti-reflection unit and the window unit may be replaced with other unit, or may be omitted.

As used herein, the expression "an element B may be directly provided on an element A" may mean that an adhesive layer or an adhesive member is not provided between the elements A and B, or that the element B is in direct contact with the element A.

Figure 2A:
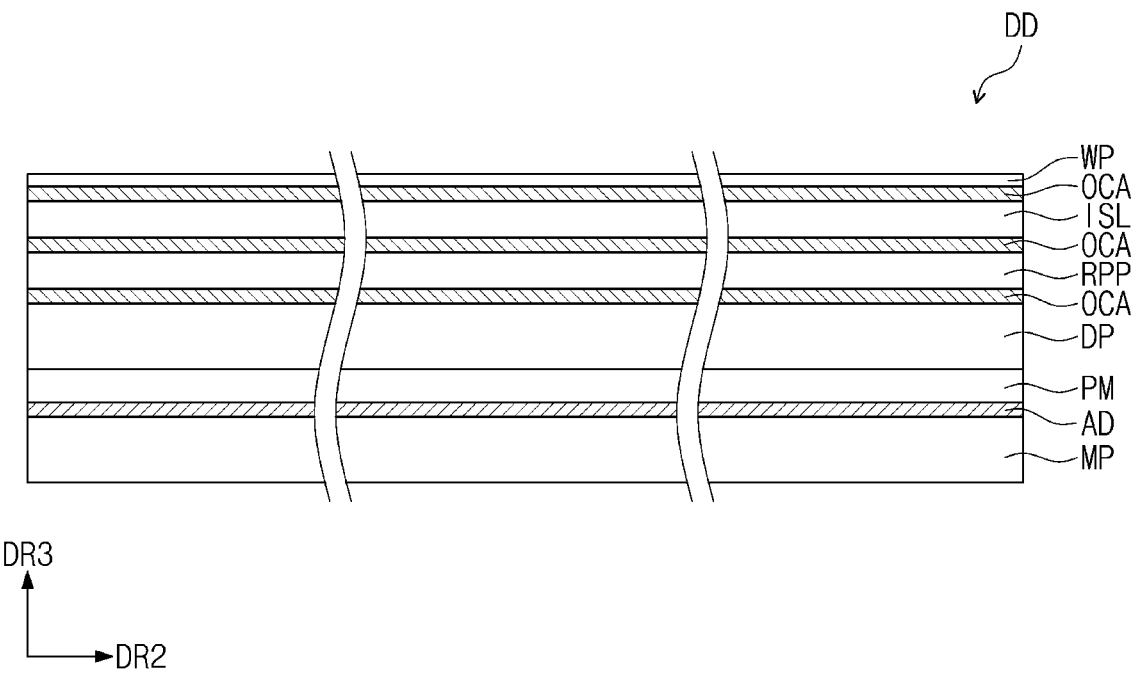

As shown in FIG. 2A, the display device DD may include a display panel DP, an anti-reflection panel RPP, an input-sensing unit ISL, a window panel WP, a protection film PM, and a supporting layer MP.

The anti-reflection panel RPP may be provided on the display panel DP, the input-sensing unit ISL may be provided on the anti-reflection panel RPP, and the window panel WP may be provided on the input-sensing unit ISL. The protection film PM may be provided below the display panel DP, and the supporting layer MP may be provided below the protection film PM. The supporting layer MP may overlap with at least the display region DD-DA (see FIG. 1), but the inventive concepts are not limited thereto.

The optically clear adhesives OCA may be respectively provided between the display panel DP and the anti-reflection panel RPP, between the anti-reflection panel RPP and the input-sensing unit ISL, and between the input-sensing unit ISL and the window panel WP.

The display panel DP may be configured to generate an image to be displayed to the outside, and the input-sensing unit ISL may be configured to obtain coordinate information regarding an external input (e.g., touch event).

According to an exemplary embodiment, the display panel DP may be a light-emitting type display panel, but the inventive concepts are not limited to a specific type of the display panel DP. For example, the display panel DP may be an organic light emitting display panel or a quantum dot light-emitting display panel. A light emitting layer of the organic light emitting display panel may be formed of or include an organic light emitting material. The light emitting layer of the quantum dot light-emitting display panel may include quantum dots and/or quantum rods. Hereinafter, the display panel DP will be described as the organic light emitting display panel.

The anti-reflection panel RPP may be configured to reduce reflectance of an external light that is incident from an outer space to the window panel WP. In some exemplary embodiments, the anti-reflection panel RPP may include a phase retarder and a polarizer. The phase retarder may be a film type or a liquid crystal coating type, and may include λ/2 and/or λ/4 phase retarder. The polarizer may also be a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection films thereof may be used as a base layer of the anti-reflection panel RPP.

In some exemplary embodiments, the anti-reflection panel RPP may include color filters. The color filters may be arranged in a specific manner. The arrangement of the color filters may be determined in consideration of colors of lights to be emitted from pixels in the display panel DP. The anti-reflection panel RPP may further include a black matrix provided adjacent to the color filters.

In some exemplary embodiments, the anti-reflection panel RPP may have a destructive interference structure. For example, the destructive interference structure may include a first reflection layer and a second reflection layer disposed on different layers. The first reflection layer and the second reflection layer may be configured to allow a first reflection light and a second reflection light, which are respectively reflected by the reflection layers to destructively interfere with each other, which may reduce reflectance of the external light.

The input-sensing unit ISL may be configured to sense a change in electrostatic capacitance caused by an external object and to determine whether there is an external input from the external object. This sensing method of the input-sensing unit ISL may be referred as a "capacitive-sensing method".

In some exemplary embodiments, the input-sensing unit ISL may be configured to sense a change in pressure caused by an external object and to determine whether there is an external input from the external object. This sensing method of the input-sensing unit ISL may be referred as a "pressure-sensing method".

The window panel WP may be configured to protect a display module DM from an external impact and provide an input surface to a user. The window panel WP may be formed of or include glass or plastic material. The window panel WP may have a transparent property, such that light generated by the display panel DP may pass therethrough.

The protection film PM may be configured to protect the display panel DP. The protection film PM may prevent outer moisture from infiltrating the display panel DP and absorb shock or impact from the outside.

The protection film PM may include a plastic film, which is used as a base layer thereof. The protection film PM may include a plastic film including one selected from the group consisting of polyethersulfone (PES), polyetherimide (PEI), polyethylenenaphthalate (PEN), polyethyleneterephthalate (PET), polyphenylene sulfide (PPS), polyacrylate, polyimide (PI), polycarbonate (PC), poly(arylene ethersulfone), and combination thereof.

Materials for the protection film PM are not limited to plastic resins. For example, organic/inorganic composites may be used for the protection film PM. The protection film PM may include a porous organic layer and an inorganic material, which is formed in pores of the organic layer. The protection film PM may further include a functional layer formed on the plastic film. The functional layer may include a resin layer. The functional layer may be formed by a coating method.

An adhesive member AD may be configured to combine the protection film PM with the supporting layer MP. The adhesive member AD nay be a pressure sensitive adhesive (PSA). The pressure sensitive adhesive may refer to a material that has an adhesive property when a pressure is applied thereto.

In some exemplary embodiments, the adhesive member AD may have a black color. When the adhesive member AD is black, it may be possible to prevent an underlying element, which is placed below the adhesive member AD, from being recognized by a user, and to meet aesthetic requirement for the display device DD.

In some exemplary embodiments, the supporting layer MP may be rigid. However, the inventive concepts are not limited thereto, and at least a portion of the supporting layer MP may be flexible.

The supporting layer MP may be formed of or include a metallic material or carbon graphite. The metallic material may include stainless steel, aluminum, iron, or copper, but the inventive concepts are not limited thereto. The stainless steel may include SUS304 or SUS316. The SUS304 may be a stainless steel containing nickel (Ni, 8-11%) and chromium (Cr, 18-20%). The SUS316 may be a stainless steel having high chemical resistance and high corrosion resistance, as compared with the SUS304.

The supporting layer MP may be laminated to the protection film PM by the adhesive member AD. The supporting layer MP may be directly and fully provided on the protection film PM, which is provided on the rear surface of the display panel DP.

The supporting layer MP may be configured to prevent components in the display device DD from being damaged by an external impact.

In addition, the supporting layer MP may be formed of or include a material having an excellent heat-dissipation property. In this manner, the supporting layer MP may effectively exhaust heat produced in the display panel DP to the outside. Accordingly, it may be possible to reduce a spatial variation in brightness of the display device DD, which may be caused by a variation in temperature between internal components of the display panel DP. Furthermore, since heat-dissipation efficiency of the display panel DP is improved by the supporting layer MP, it may be possible to prevent a user from being injured by heat produced in the display panel DP (e.g., by low temperature burn).

Due to the rigid property of the supporting layer MP, components on the supporting layer MP may be provided with a high degree of flatness. When internal components of the display device DD have a high degree of flatness, the display device DD may have an excellent aesthetic appearance, even when it is in a turn-off state.

Figure 2B:
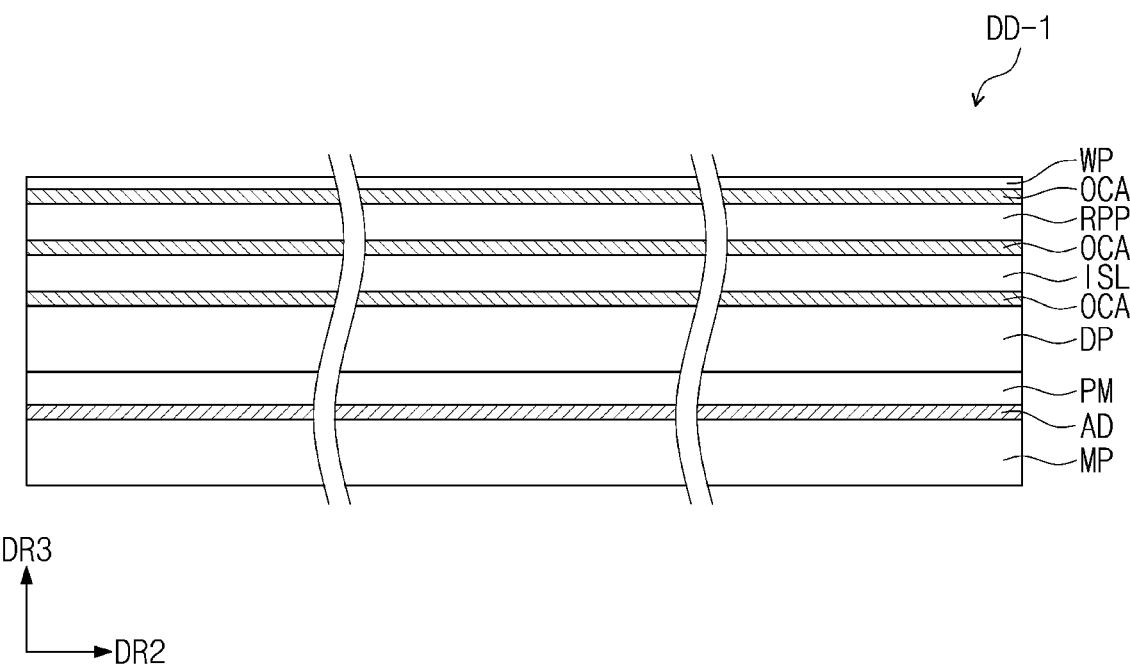

Referring to FIG. 2B, in the display device DD-1, a stacking order of the input-sensing unit ISL and the anti-reflection panel RPP may be different from that of the display device DD of FIG. 2A.

Figure 2C:
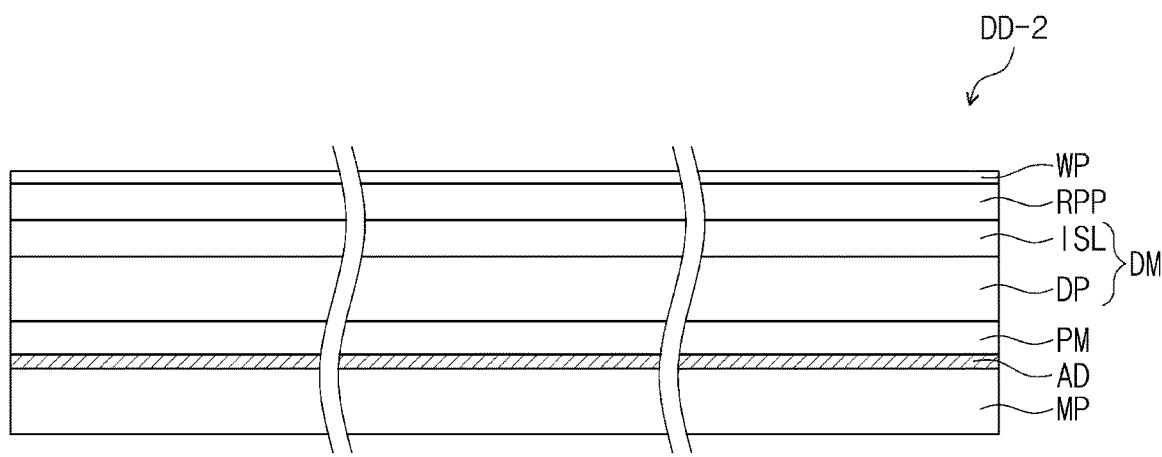

As shown in FIG. 2C, the display device DD-2 may be configured to include the display module DM, the anti-reflection panel RPP, the window panel WP, the protection film PM, and the supporting layer MP.

The display module DM may include the display panel DP and the input-sensing unit ISL. The input-sensing unit ISL may be directly provided on the display panel DP. In other words, the input-sensing unit ISL may be formed on the display panel DP serving as a base surface by a successive process.

In addition, the anti-reflection panel RPP or the window panel WP may also be formed by a successive process. However, the inventive concepts are not limited thereto, and the anti-reflection panel RPP or the window panel WP may be formed by an attaching process using the optically clear adhesive OCA.

In some exemplary embodiments, a stacking order of the input-sensing unit ISL and the anti-reflection panel RPP may be changed.

Figure 2D:
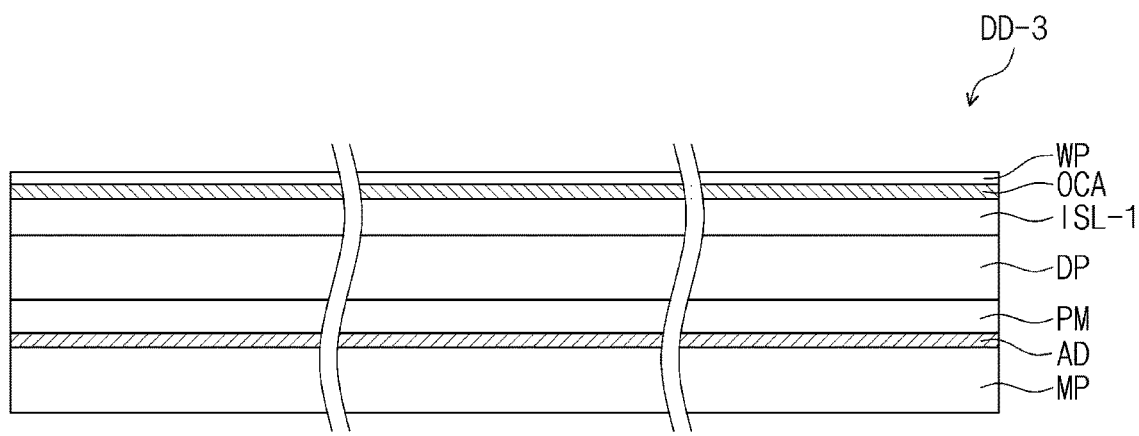

As shown in FIGS. 2D and 2E, the anti-reflection panel RPP may not be provided in the display device DD-3 or DD-4.

As shown in FIG. 2D, the display device DD-3 may be configured to include an input-sensing unit ISL-1, the display panel DP, and the window panel WP. Here, the input-sensing unit ISL-1 may be configured to have an anti-reflection function, unlike the input-sensing units ISL of FIGS. 2A to 2C.

As shown in FIG. 2E, the display device DD-4 may be configured to include a display panel DP-1, the input-sensing unit ISL, and the window panel WP. Here, the display panel DP-1 may be configured to have an anti-reflection function, unlike the display panels DP of FIGS. 2A to 2D.

In FIGS. 2A to 2E, the input-sensing unit ISL or ISL-1 is shown as being fully overlapped with the display panel DP or DP-1. However, in some exemplary embodiments, the input-sensing unit ISL or ISL-1 may be overlapped with only a portion of the display region DD-DA or with only the non-display region DD-NDA. The input-sensing unit ISL or ISL-1 may be a touch-sensing panel, which is configured to sense a touch event from a user, or a fingerprint-sensing panel, which is configured to read a fingerprint of a user's finger. The input-sensing unit ISL or ISL-1 may include a plurality of sensor electrodes, and a pitch or width of the sensor electrodes may be changed according to an intended use of the input-sensing unit ISL or ISL-1. For the touch-sensing panel, the sensor electrodes may have a width ranging from several millimeters to several tens of millimeters, whereas for the fingerprint-sensing panel, the sensor electrodes may have a width ranging from several tens of micrometers to several hundreds of micrometers.

Figure 3:
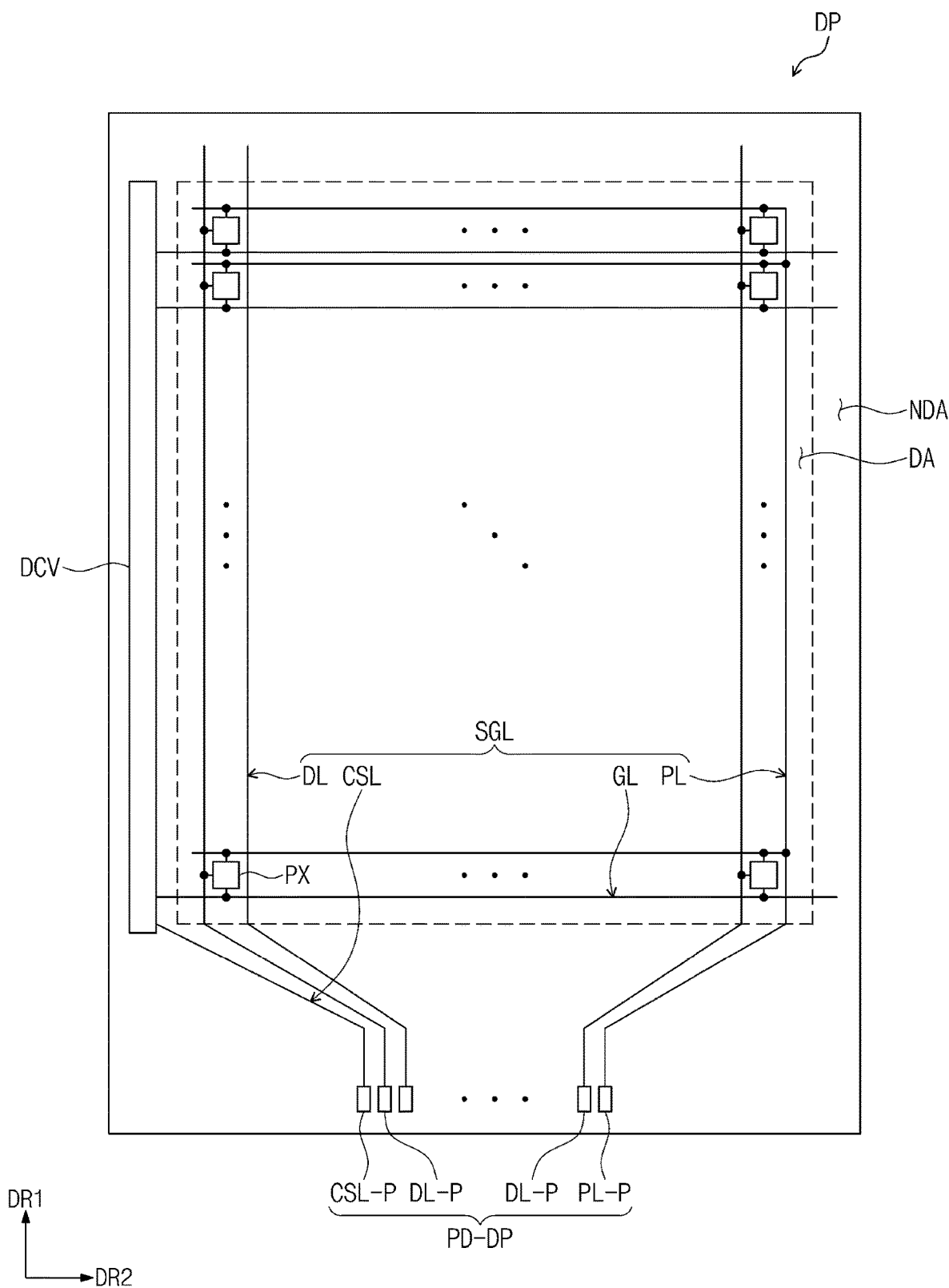
FIG. 3 is a plan view illustrating a display panel according to an exemplary embodiment.
Figure 4:
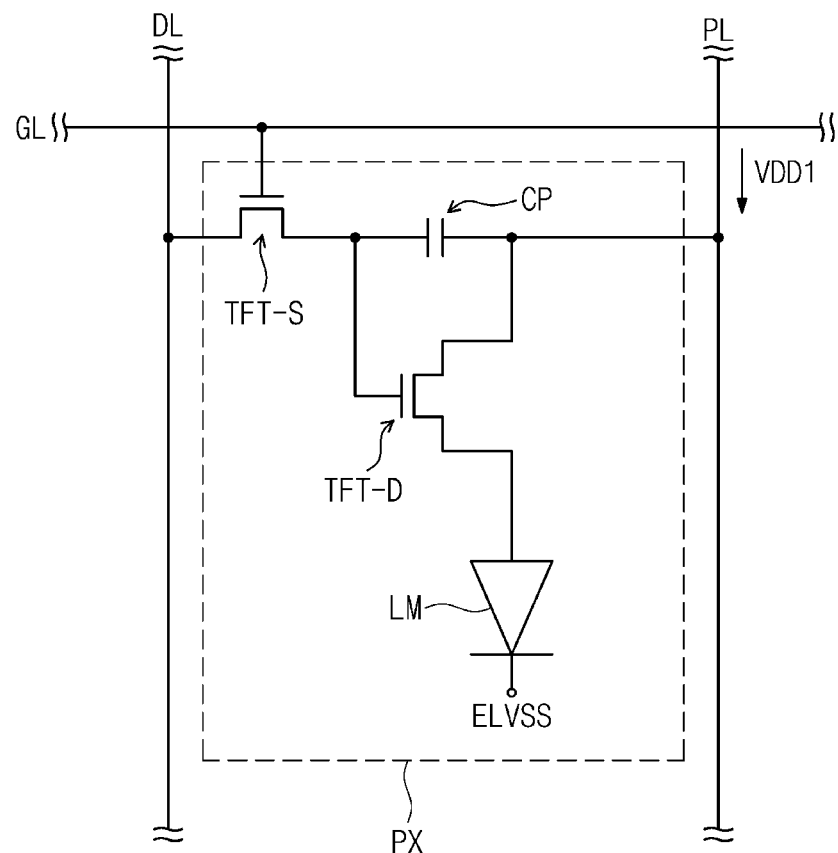
FIG. 4 is an equivalent circuit diagram of a pixel according to an exemplary embodiment.

FIG. 3 is a plan view of the display panel DP according to an exemplary embodiment. FIG. 4 is an equivalent circuit diagram of a pixel PX according to an exemplary embodiment.

Referring to FIG. 3, the display panel DP may include a display region DA and a non-display region NDA, when viewed in a plan view. The display region DA and the non-display region NDA of the display panel DP may correspond to the display region DD-DA and the non-display region DD-NDA, respectively, of the display device DD (see FIG. 1). In some exemplary embodiments, the display and non-display regions DA and NDA of the display panel DP may not be the same as the display and non-display regions DD-DA and DD-NDA of the display device DD, and may be changed according to the structure or design of the display panel DP.

The display panel DP may include a plurality of signal lines SGL and a plurality of pixels PX. A region including the plurality of pixels PX may be defined as the display region DA. In the present exemplary embodiment, the non-display region NDA may be defined along an edge or circumference of the display region DA.

The plurality of signal lines SGL may include gate lines GL, data lines DL, a power line PL, and a control signal line CSL. Each of the gate lines GL may be connected to corresponding ones of the plurality of pixels PX, and each of the data lines DL may be connected to corresponding ones of the plurality of pixels PX. The power line PL may be connected to the plurality of pixels PX. A gate driving circuit DCV, to which the gate lines GL are connected, may be provided at a side region of the non-display region NDA. The control signal line CSL may be used to provide control signals to the gate driving circuit DCV.

Some of the gate lines GL, the data lines DL, the power line PL, and the control signal line CSL may be disposed on the same layer, and at least one of the gate lines GL, the data lines DL, the power line PL, and the control signal line CSL may be disposed on layers different from each other.

Each of the gate lines GL, the data lines DL, the power line PL, and the control signal line CSL may include a signal line portion and a display panel pad PD-DP connected to an end of the signal line portion. The signal line portion may be defined as the remaining portion of each of the gate lines GL, the data lines DL, the power line PL, and the control signal line CSL, except for the display panel pad PD-DP thereof.

The display panel pads PD-DP may be formed by the same process as that for forming transistors for driving the pixels. For example, the display panel pads PD-DP may be formed by the low temperature polycrystalline silicon (LTPS) or low temperature polycrystalline oxide (LTPO) process.

In some exemplary embodiments, the display panel pads PD-DP may include a control pad CSL-P, a data pad DL-P, and a power pad PL-P. A gate pad may further be provided to be overlapped with the gate driving circuit DCV, and may be used to provide a signal path to the gate driving circuit DCV. A portion of the non-display region NDA, in which the control pad CSL-P, the data pad DL-P, and the power pad PL-P are disposed, may be referred to as a pad region.

Referring to FIG. 3, a top-side region, a bottom-side region, a left-side region, and a right-side region may be defined in the display panel DP. The bottom-side region of the display panel DP may include the display panel pads PD-DP in the first direction DR1. The top-side region of the display panel DP may face the bottom-side region of the display panel DP in the first direction DR1.

In FIG. 3, the left-side region of the display panel DP may include the gate driving circuit DCV. The right-side region of the display panel DP may face the right-side region of the display panel DP.

As used herein, an upward direction, a downward direction, a leftward direction, and a rightward direction will be respectively used to indicate directions toward the top-side region, the bottom-side region, the left-side region, and the right-side region of the display panel DP. However, the top-side region, the bottom-side region, the left-side region, and the right-side region of the display panel DP are not limited to the above example and may be used to indicate other regions of the display panel DP.

FIG. 4 illustrates one of the pixels PX that is connected to one of the gate lines GL, one of the data lines DL, and the power line PL according to an exemplary embodiment.

However, the inventive concepts are not limited thereto, and the structure of the pixel PX may be variously changed.

The pixel PX may include a light-emitting device LM, which may serve as a display element. The light-emitting device LM may be a top-emission type diode or a bottom-emission type diode. In some exemplary embodiments, the light-emitting device LM may be a double-sided emission type diode. The light-emitting device LM may be an organic light emitting diode (OLED). The pixel PX may include a switching transistor TFT-S and a driving transistor TFT-D, which are used to control operations of the light-emitting device LM, and a capacitor CP. The light-emitting device LM may generate light in response to electrical signals transmitted from the transistors TFT-S and TFT-D.

The switching transistor TFT-S may be configured to output a data signal applied to the data line DL, in response to a scan signal applied to the gate line GL. The capacitor CP may be charged with a voltage level corresponding to the data signal transmitted through the switching transistor TFT-S.

The driving transistor TFT-D may be connected to the light-emitting device LM. The driving transistor TFT-D may control a driving current passing through the light-emitting device LM, based on the amount of electric charges stored in the capacitor CP. The light-emitting device LM may emit light, when the driving transistor TFT-D is in a turned-on state. The power line PL may be used to supply a first power voltage VDD1 to the light-emitting device LM.

Figure 5:
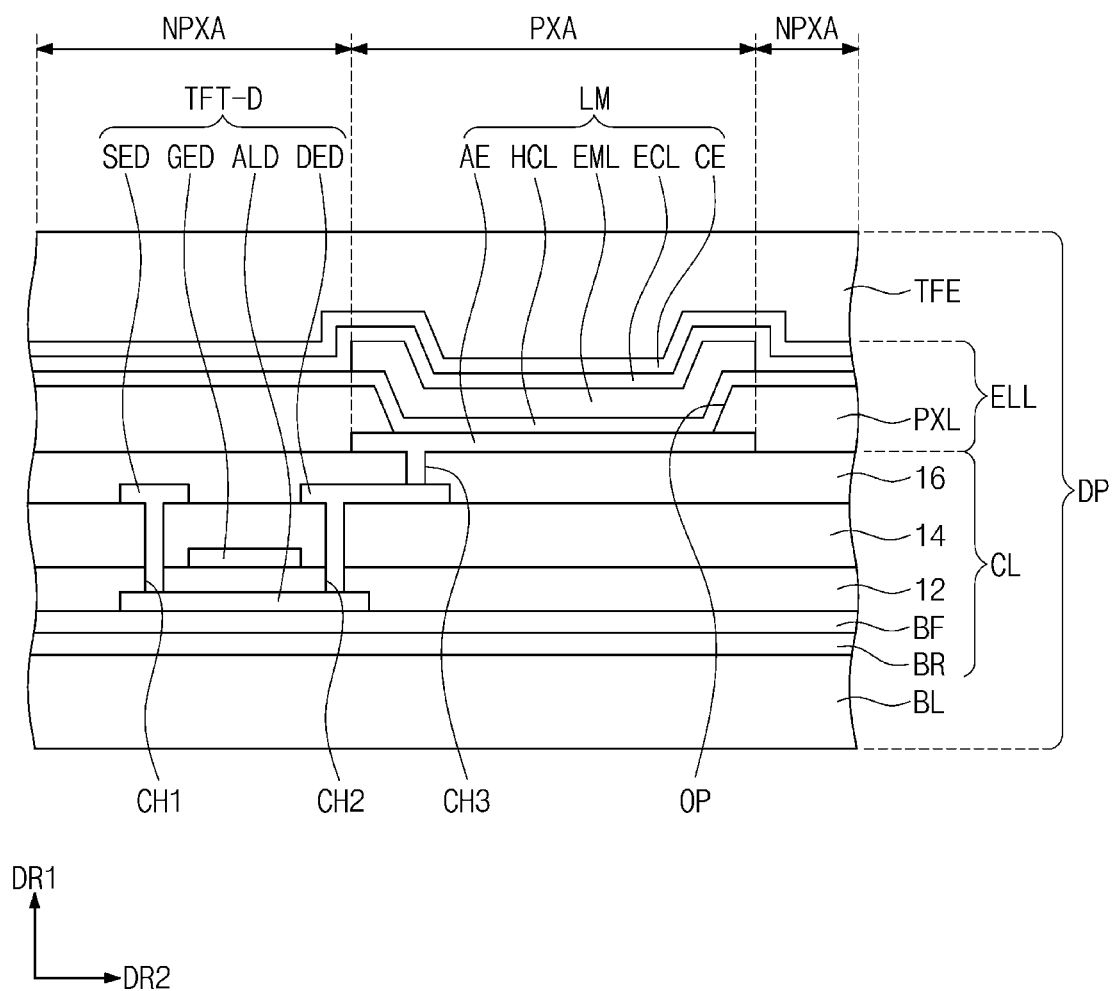
FIG. 5 is a cross-sectional view illustrating a pixel according to an exemplary embodiment.

FIG. 5 is a cross-sectional view illustrating a portion of the pixel PX according to an exemplary embodiment. In particular, FIG. 5 shows a cross-sectional view of a region, in which the driving TFT-D and the light-emitting device LM shown in FIG. 4 are provided.

As shown in FIG. 5, a circuit layer CL may be provided on a base layer BL. The driving transistor TFT-D may include a semiconductor pattern ALD that is provided on the base layer BL. The semiconductor pattern ALD may be formed of or include at least one of amorphous silicon, poly silicon, or metal oxide semiconductor materials.

The circuit layer CL may include organic/inorganic layers BR, BF, 12, 14, and 16, in addition to the switching transistor TFT-S and the driving transistor TFT-D described with reference to FIG. 4. The organic/inorganic layers BR, BF, 12, 14, and 16 may include functional layers BR and BF, a first insulating layer 12, a second insulating layer 14, and a third insulating layer 16.

The functional layers BR and BF may be provided on a surface of the base layer BL. The functional layers BR and BF may include at least one of a barrier layer BR or a buffer layer BF. The semiconductor pattern ALD may be placed on the barrier layer BR or on the buffer layer BF.

The first insulating layer 12 may be provided on the base layer BL to cover the semiconductor pattern ALD. The first insulating layer 12 may include an organic layer and/or an inorganic layer. In some exemplary embodiments, the first insulating layer 12 may include a plurality of inorganic thin-films, such as a silicon nitride layer and a silicon oxide layer.

The driving transistor TFT-D may include a control electrode GED that is provided on the first insulating layer 12. Although not shown, the switching transistor TFT-S may also include a control electrode that is provided on the first insulating layer 12. The control electrode GED and the gate line GL (see FIG. 4) may be formed using the same photolithography process. In other words, the control electrode GED may be formed of the same material as the gate lines GL, and the control electrode GED and the gate lines GL may have the same stacking structure and be disposed on the same layer.

The second insulating layer 14 may be provided on the first insulating layer 12 to cover the control electrode GED. The second insulating layer 14 may include an organic layer and/or an inorganic layer. In some exemplary embodiments, the second insulating layer 14 may include a plurality of inorganic thin-films, such as a silicon nitride layer and a silicon oxide layer.

The data line DL (see FIG. 4) may be provided on the second insulating layer 14. The driving transistor TFT-D may include an input electrode SED and an output electrode DED that are provided on the second insulating layer 14. Although not shown, the switching transistor TFT-S may also include an input electrode and an output electrode that are provided on the second insulating layer 14. The input electrode SED may be a portion that is branched off from a corresponding one of the data lines DL. The power line PL (see FIG. 4) and the data lines DL may be different portions of the same layer. The input electrode SED may be branched off from the power line PL.

A portion of an electrode of the capacitor CP may be provided on the second insulating layer 14. The portion of the electrode of the capacitor CP may be formed using the same photolithography process as those for forming the data lines DL and the power line PL. In this case, the portion of the electrode of the capacitor CP, the data lines DL, and the power line PL may be formed of the same material, disposed on the same layer, and have the same stacking structure.

The input electrode SED and the output electrode DED may be connected to respective portions of the semiconductor pattern ALD through a first through hole CH1 and a second through hole CH2, which are formed to penetrate both of the first insulating layer 12 and the second insulating layer 14. In some exemplary embodiments, the switching transistor TFT-S and the driving transistor TFT-D may be configured to have a bottom gate structure.

The third insulating layer 16 may be provided on the second insulating layer 14 to cover the input electrode SED and the output electrode DED. The third insulating layer 16 may include an organic layer and/or an inorganic layer. In some exemplary embodiments, the third insulating layer 16 may include an organic material and may have a flat top surface.

According to a circuit structure of the pixel, one of the first insulating layer 12, the second insulating layer 14, and the third insulating layer 16 may be omitted. Each of the second insulating layer 14 and the third insulating layer 16 may be defined as an interlayered insulating layer. The interlayered insulating layer may be provided between vertically-separated conductive patterns and be used to electrically disconnect the conductive patterns from each other.

A light-emitting device layer ELL may be provided on the third insulating layer 16. The light-emitting device layer ELL may include a pixel definition layer PXL and the light-emitting device LM. An anode AE may be provided on the third insulating layer 16. The anode AE may be connected to the output electrode DED of the driving transistor TFT-D through a third through hole CH3, which is formed to penetrate the third insulating layer 16. An opening OP may be defined in the pixel definition layer PXL. The opening OP of the pixel definition layer PXL may expose a portion of the anode AE.

The light-emitting device layer ELL may include a light-emitting region PXA and a non-light-emitting region NPXA adjacent to the light-emitting region PXA. The non-lightemitting region NPXA may be provided to enclose the light-emitting region PXA. In the present exemplary embodiment, the light-emitting region PXA may be defined to correspond to the anode AE. However, the structure or position of the light-emitting region PXA is not limited thereto. For example, the light-emitting region PXA may be defined as a region, from which light is emitted. In some exemplary embodiments, the light-emitting region PXA may be defined to correspond to the portion of the anode AE exposed by the opening OP.

A hole control layer HCL may be provided in common on the light-emitting region PXA and the non-light-emitting region NPXA. Although not shown, a common layer, such as the hole control layer HCL, may be provided in common in a plurality of the pixels PX (see FIG. 3).

A light emitting layer EML may be provided on the hole control layer HCL. The light emitting layer EML may be locally provided only in a region corresponding to the opening OP. In other words, the light emitting layer EML may be divided into a plurality of patterns that are formed in the plurality of pixels PX, respectively.

The light emitting layer EML may include an organic material or an inorganic material. An electron control layer ECL may be provided on the light emitting layer EML. A cathode CE may be provided on the electron control layer ECL. The cathode CE may be placed in common on the plurality of pixels PX.

In the present exemplary embodiment, the light emitting layer EML is illustrated to have a patterned structure, but in some exemplary embodiments, the light emitting layer EML may be provided in common to span the plurality of pixels PX. In this case, the light emitting layer EML may be configured to emit a white-color light. In some exemplary embodiments, the light emitting layer EML may be provided to have a multi-layered structure.

In the present exemplary embodiment, a thin encapsulation layer TFE may be provided to directly cover the cathode CE. In some exemplary embodiments, a capping layer may be further provided to cover the cathode CE. In this case, the thin encapsulation layer TFE may be provided to directly cover the capping layer. The thin encapsulation layer TFE may include at least one of organic and inorganic layers.

Figure 6:
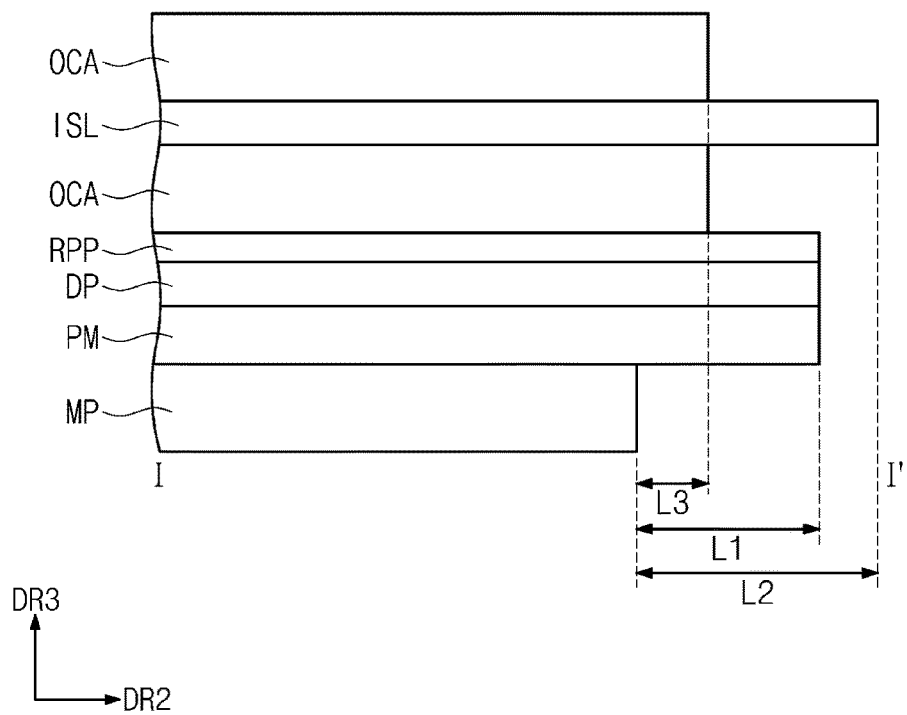
FIG. 6 is a cross-sectional view illustrating a portion of a vertical section taken along line I-I' of FIG. 1.
Figure 7:
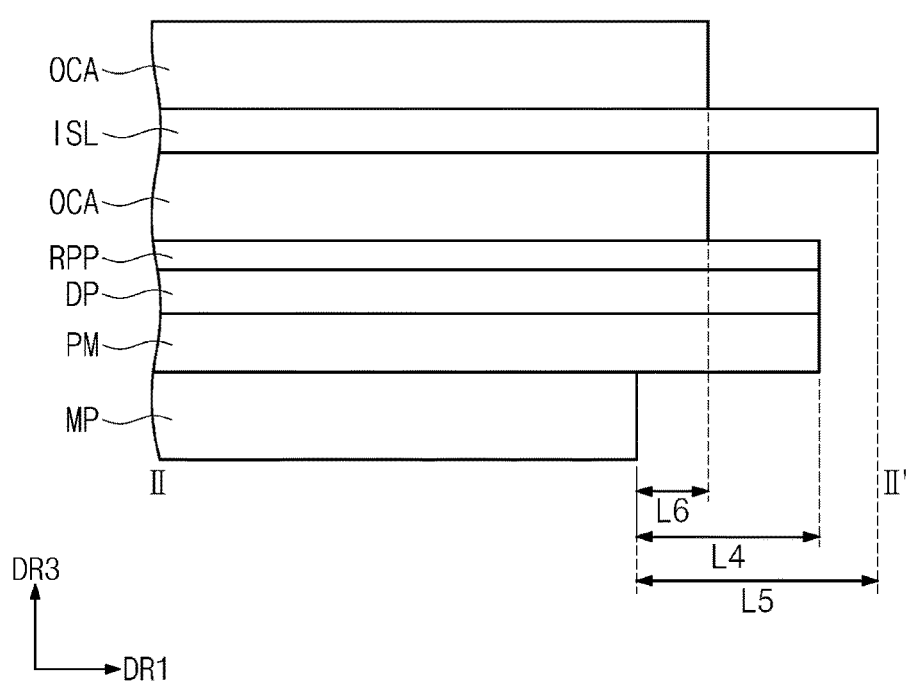
FIG. 7 is a cross-sectional view illustrating a portion of a vertical section taken along line II-II' of FIG. 1.
Figure 8:
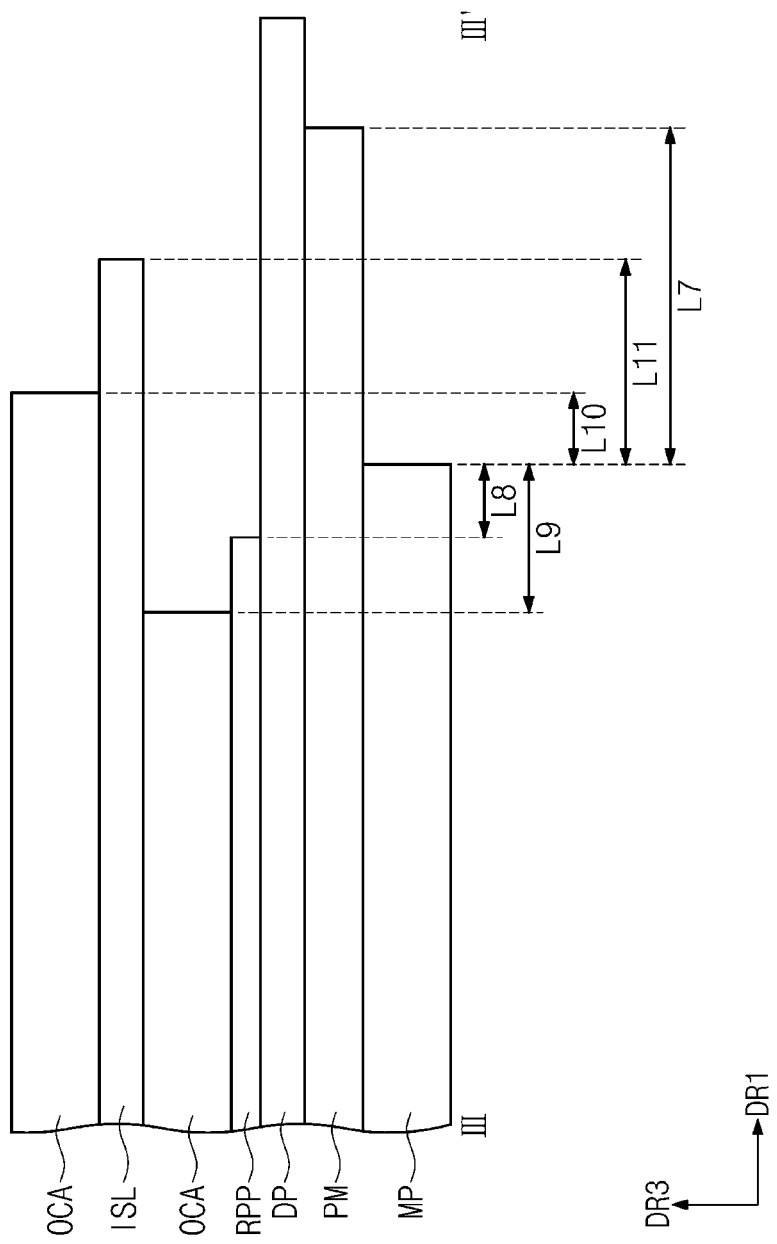
FIG. 8 is a cross-sectional view illustrating a portion of a vertical section taken along line III-III' of FIG. 1.

FIG. 6 is a cross-sectional view illustrating a portion of a vertical section taken along line I-I' of FIG. 1. FIG. 7 is a cross-sectional view illustrating a portion of a vertical section taken along line II-II' of FIG. 1. FIG. 8 is a cross-sectional view illustrating a portion of a vertical section taken along line III-III' of FIG. 1.

Referring to FIGS. 6 to 8, at least one of components stacked in the third direction DR3 to form the display device DD may have a length or width that is different from others in the first direction DR1 or the second direction DR2. For example, one of the components may protrude outwardly from another component, in the first direction DR1 or the second direction DR2.

Referring to FIG. 6, the display panel DP may include a portion protruding outwardly from the supporting layer MP by a first length L1 in the second direction DR2. The first length L1 may range from about 160 µm to 180 µm.

The input-sensing unit ISL may include a portion protruding outwardly from the supporting layer MP by a second length L2 in the second direction DR2. The second length L2 may be longer by about 40 µm to 60 µm than the first length L1.

The optically clear adhesive OCA provided below the input-sensing unit ISL may include a portion protruding outwardly from the supporting layer MP by a third length L3 in the second direction DR2. The third length L3 may range from about 20 µm to 30 µm.

The input-sensing unit ISL may be outwardly protruded from the optically clear adhesive OCA, which is provided thereunder, by about 170 µm to 220 µm in the second direction DR2.

Although FIG. 6 illustrates a vertical section of the right-side region of the display device DD shown in FIG. 1, the left-side region of the display device DD may have a shape corresponding to that shown in FIG. 6. Thus, when measured in the second direction DR2, a length of the supporting layer MP may be less than lengths of the display panel DP, the anti-reflection panel RPP, and the input-sensing unit ISL.

Referring to FIG. 7, the display panel DP may include a portion protruding outwardly from the supporting layer MP by a fourth length L4 in the first direction DR1. The fourth length L4 may range from about 160 µm to 180 µm.

The input-sensing unit ISL may include a portion protruding outwardly from the supporting layer MP by a fifth length L5 in the first direction DR1. The fifth length L5 may be longer by about 20 µm to 40 µm than the fourth length L4.

The optically clear adhesive OCA provided below the input-sensing unit ISL may include a portion protruding outwardly from the supporting layer MP by a sixth length L6 in the first direction DR1. The sixth length L6 may range from about 3 µm to 8 µm.

The input-sensing unit ISL may be outwardly protruded from the optically clear adhesive OCA, which is provided thereunder, by about 180 µm to 220 µm (or about 172 µm to 217 µm) in the first direction DR1.

Referring to FIG. 8, the protection film PM may include a portion protruding outwardly from the supporting layer MP by a seventh length L7 in the first direction DR1. The seventh length L7 may range from about 200 µm to 250 µm.

The display panel DP may include a portion protruding outwardly from the protection film PM in the first direction DR1.

The supporting layer MP may include a portion protruding outwardly from the anti-reflection panel RPP by an eighth length L8 in the first direction DR1. The eighth length L8 may range from about 100 µm to 150 µm. Thus, a portion of the supporting layer MP may not be overlapped with the anti-reflection panel RPP, but may be overlapped with the display panel DP, in the third direction DR3.

The supporting layer MP may include a portion protruding outwardly from the optically clear adhesive OCA, which is provided below the input-sensing unit ISL, by a ninth length L9 in the first direction DR1, and the optically clear adhesive OCA (e.g., the top OCA in FIG. 8) provided on the input-sensing unit ISL may include a portion protruding outwardly from the supporting layer MP by a tenth length L10 in the first direction DR1. That is, in the third direction DR3, a portion of the supporting layer MP may not be overlapped with the optically clear adhesive OCA disposed below the input-sensing unit ISL, and may be overlapped with the optically clear adhesive OCA disposed on the input-sensing unit ISL.

The input-sensing unit ISL may include a portion protruding outwardly from the supporting layer MP by an eleventh length L11 in the first direction DR1.

The input-sensing unit ISL may be outwardly protruded from the optically clear adhesive OCA, which is provided thereunder, by about 900 µm to 1 mm in the first direction DR1. The input-sensing unit ISL may be outwardly protruded from the optically clear adhesive OCA disposed thereon by about 280 µm to 360 µm in the first direction DR1.

Figure 9:
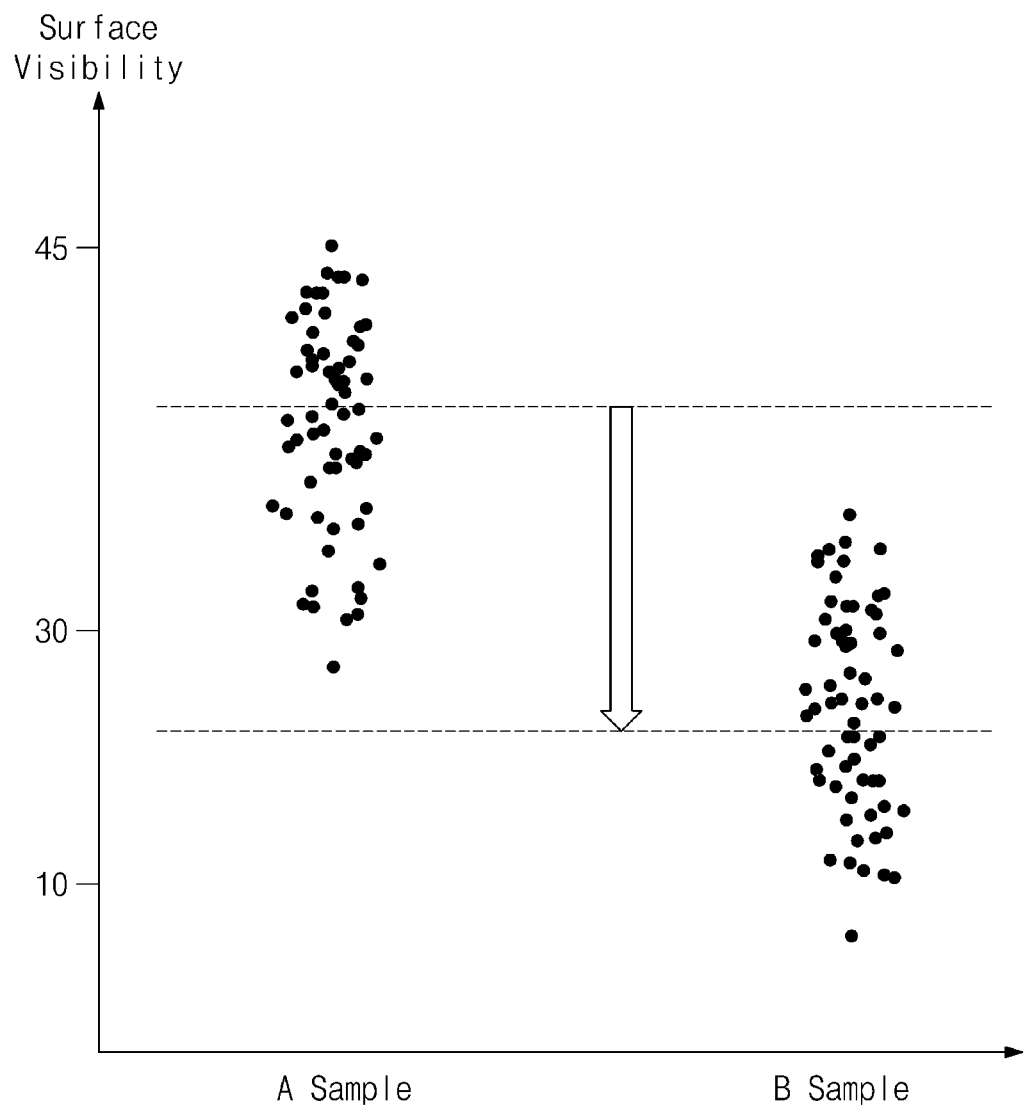
FIG. 9 is a graph showing a difference in visibility of surface wrinkles between a display device according to an exemplary embodiments and a conventional display device.

FIG. 9 is a graph showing a difference in visibility of surface wrinkles between the display device DD according to an exemplary embodiment and a conventional display device.

In FIG. 9, A sample represents a display device not provided with a supporting layer, and B sample represents the display device DD including the supporting layer MP according to an exemplary embodiment.

As can be seen in FIG. 9, visibility of a surface wrinkle in the B sample B according to the exemplary embodiment is lower than that in the A sample. This is because the structures on the supporting layer MP have a high degree of flatness due to the presence of the supporting layer MP.

Figure 10A:
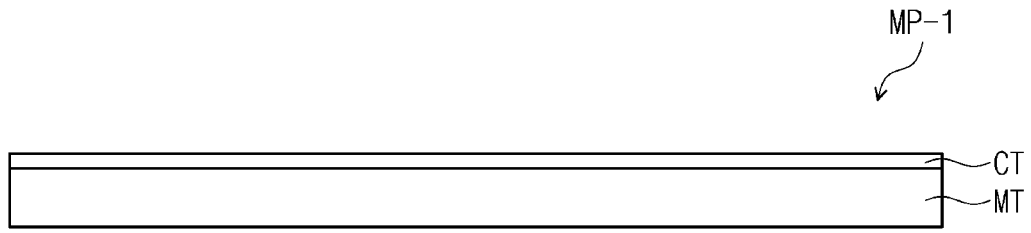
FIG. 10A, FIG. 10B, and FIG. 10C are cross-sectional views illustrating supporting layers according to exemplary embodiments.
Figure 10B:
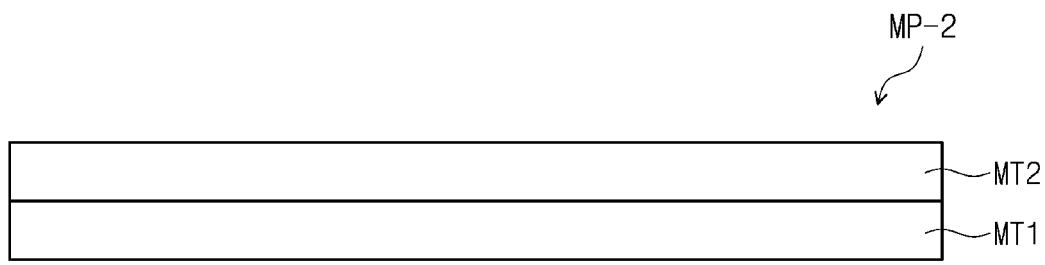
Figure 10C:
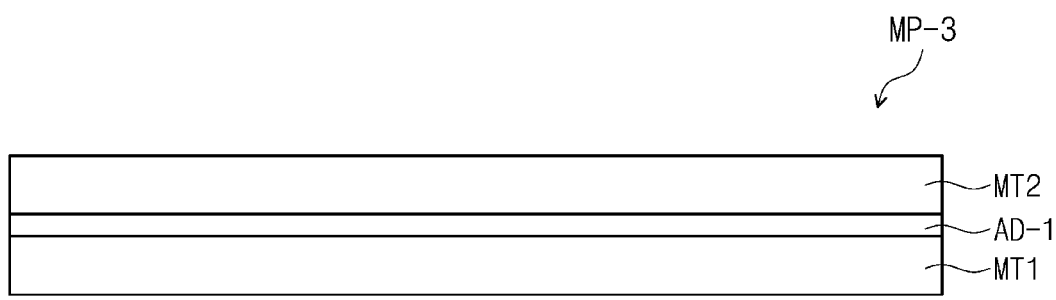

FIGS. 10A, 10B, and 10C are cross-sectional views illustrating supporting layers MP-1, MP-2, and MP-3 according to exemplary embodiments.

Referring to FIG. 10A, the supporting layer MP-1 may include a metal layer MT and a plating layer CT.

The metal layer MT may be formed of or include a metallic material (e.g., stainless steel, aluminum, iron, or copper). The plating layer CT may be formed of or include nickel (Ni). The plating layer CT may be formed on the metal layer MT by a plating or coating method.

The plating layer CT may have a black color. Since the plating layer CT is black, components provided below the plating layer CT may not be recognized by an external user. As such, the display device DD may have an excellent aesthetic appearance.

The plating layer CT may provide a surface, to which the protection film PM is attached by the adhesive member AD.

Referring to FIG. 10B, the supporting layer MP-2 may include a first metal layer MT1 and a second metal layer MT2.

The first metal layer MT1 may be formed of or include a first metallic material, and the second metal layer MT2 may be formed of or include a second metallic material. The first metallic material may be different from the second metallic material.

By using the first and second metal layers MT1 and MT2 including different metallic materials, it may be possible to combine technical advantages of the different metallic materials. For example, when the first metallic material has an excellent heat-dissipation property and the second metallic material has an excellent rigidity, the supporting layer MP-2 including the first and second metallic materials may have excellent heat-dissipation and rigidity properties.

Referring to FIG. 10C, the supporting layer MP-3 may include an adhesive member AD-1, in addition to the first metal layer MT1 and the second metal layer MT2. The adhesive member AD-1 may be provided between the first metal layer MT1 and the second metal layer MT2, which may enhance the combination of the metal layers MT1 and MT2 with each other.

Figure 11A:
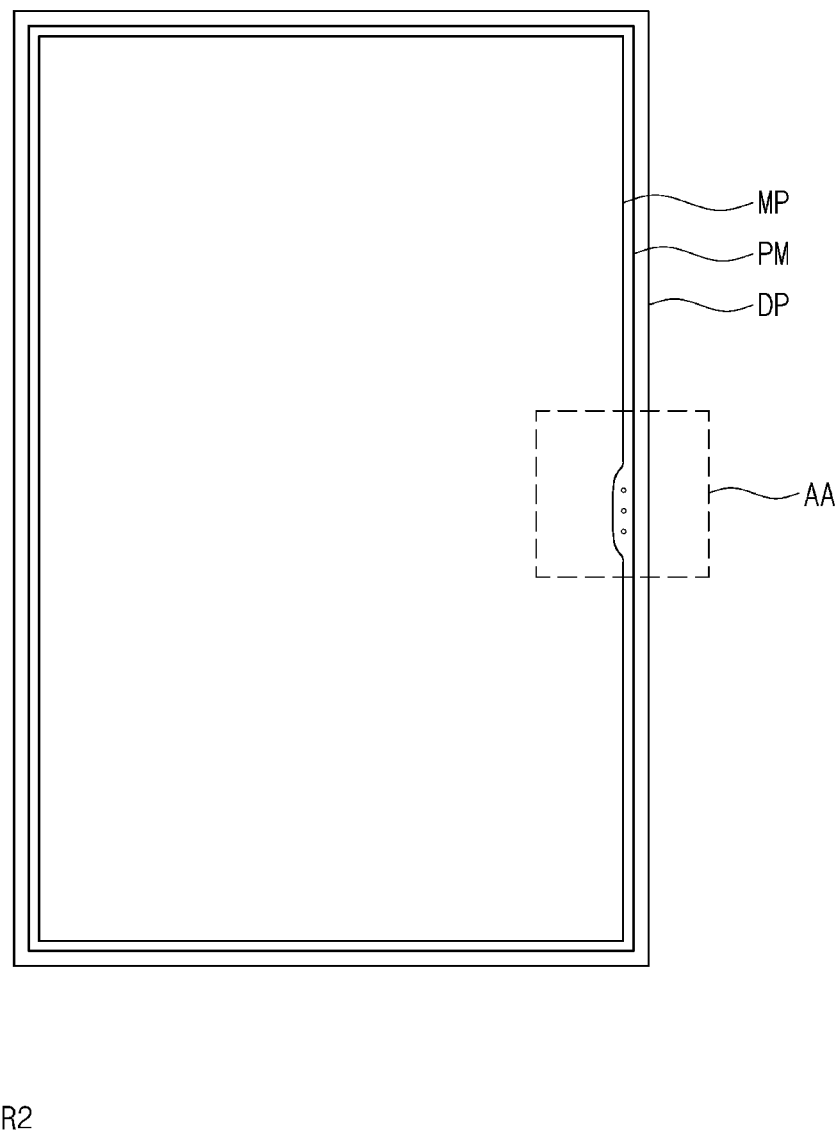
FIG. 11A is a plan view illustrating a structure, in which a display panel, a protection film, and a supporting layer are stacked, according to an exemplary embodiment.
Figure 11B:
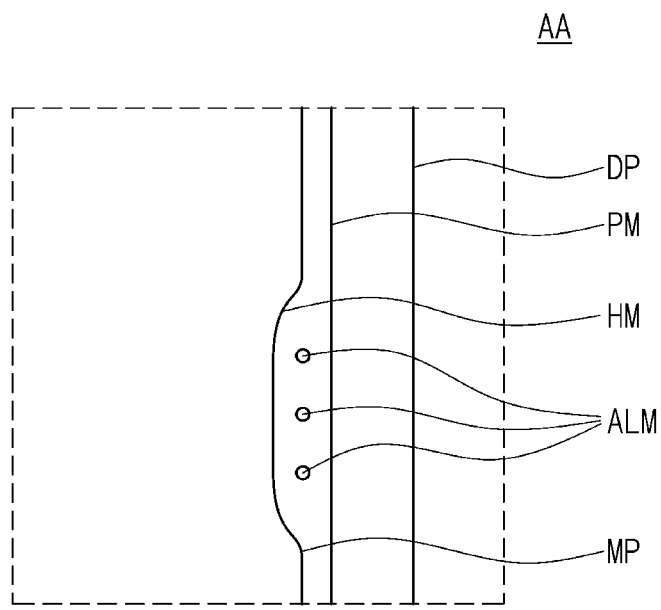
FIG. 11B is an enlarged view of portion 'AA' of FIG. 11A.

FIG. 11A is a plan view illustrating a structure, in which the display panel DP, the protection film PM, and the supporting layer MP are stacked, according to an exemplary embodiment. FIG. 11B is an enlarged view of a portion 'AA' of FIG. 11A.

Each of FIGS. 11A and 11B illustrate a shape of the display device DD of FIG. 1, when viewed from below.

In some exemplary embodiments, alignment marks ALM may be defined on or in a surface of the protection film PM. The alignment marks ALM may be used to align components to each other, when the components are combined to each other. In some exemplary embodiments, the alignment marks ALM may be defined on the display panel DP, instead on the protection film PM.

In some exemplary embodiments, an edge portion of the supporting layer MP may be inwardly recessed in the first direction DR1 or in the second direction DR2 to define a recessed region HM. The recessed region HM may be formed to expose the alignment marks ALM, such that the supporting layer MP may not block forming additional components therebelow.

A shape or position of the recessed region HM is not limited to the above example and may be changed in consideration of positions or shapes of the alignment marks ALM.

Figure 12:
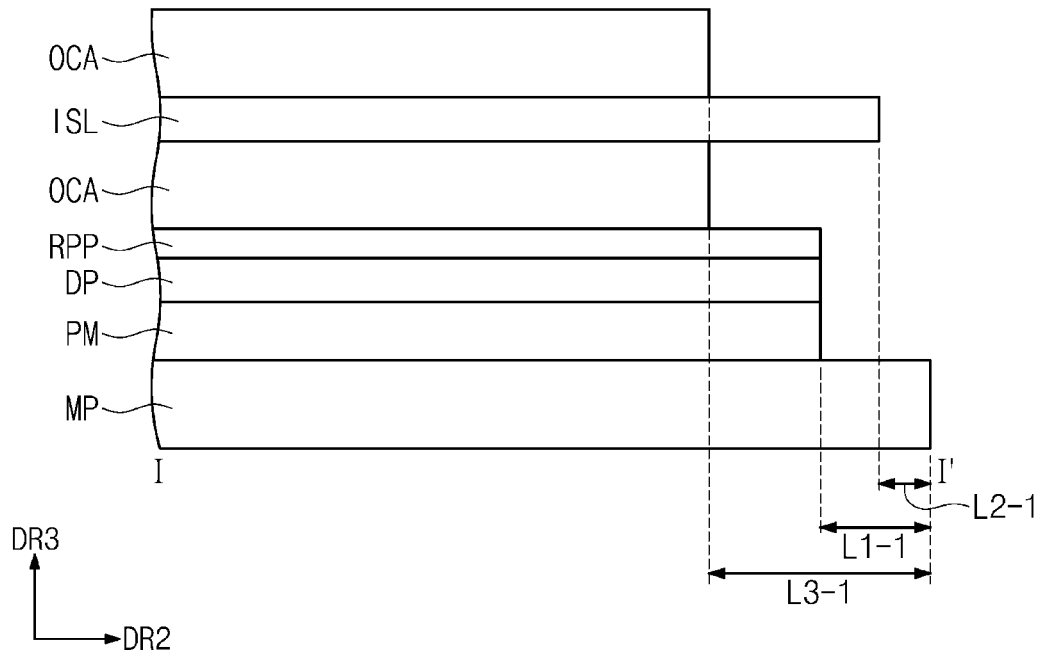
FIG. 12 is a cross-sectional view illustrating a portion of a vertical section taken along line I-I' of FIG. 1.

FIG. 12 is a cross-sectional view illustrating a portion of a vertical section taken along line I-I' of FIG. 1.

As shown in FIG. 12, unlike in FIG. 6, the supporting layer MP may be protruded from the display panel DP by a first length L1-1, from the input-sensing unit ISL by a second length L2-1, and from the optically clear adhesive OCA disposed below the input-sensing unit ISL, by a third length L3-1, in the second direction DR2. Since the supporting layer MP protrudes from other components, durability of a display device against an external impact may be improved.

Figure 13:
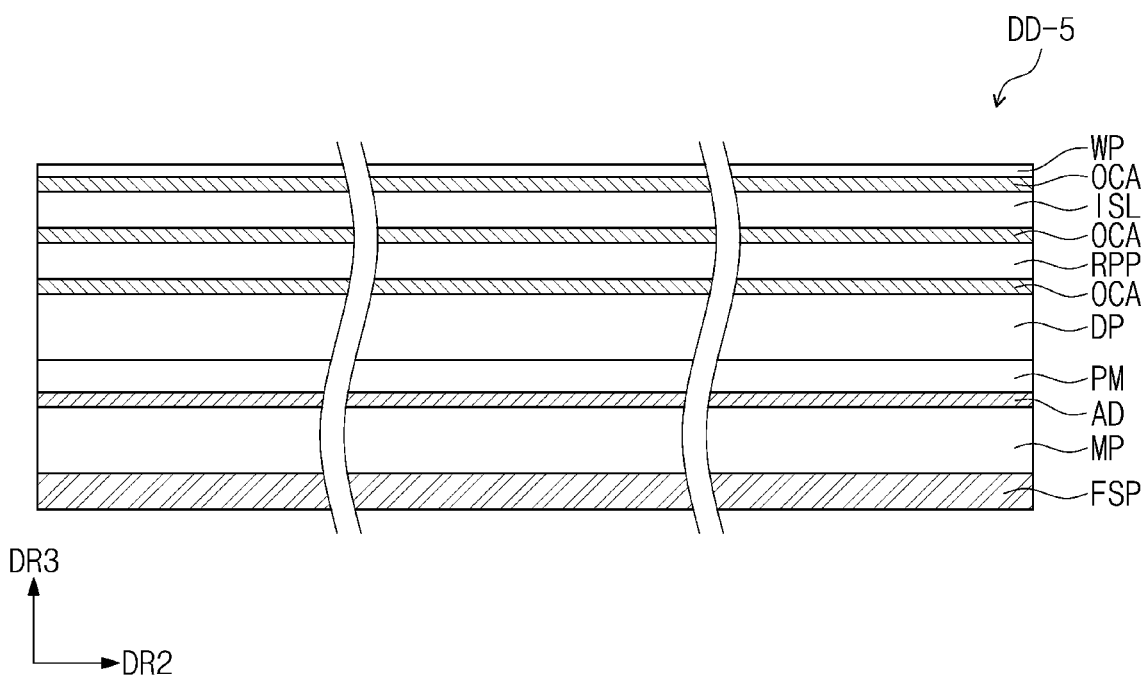
FIG. 13 is a cross-sectional view illustrating a display device according to an exemplary embodiment.

FIG. 13 is a cross-sectional view illustrating a display device DD-5 according to an exemplary embodiment. The display device DD-5 may include the display panel DP, the anti-reflection panel RPP, the input-sensing unit ISL, the window panel WP, the protection film PM, the supporting layer MP, and a pressure-sensing unit FSP.

The pressure-sensing unit FSP may be configured to measure the magnitude of an external pressure. When the display device DD-5 includes the input-sensing unit ISL and the pressure-sensing unit FSP, it may be possible to detect the occurrence of a touch event and the magnitude of an external pressure, and thereby to more effectively utilize the display device DD-5.

The pressure-sensing unit FSP may include a force sensor. In some exemplary embodiments, the force sensor may include at least one strain gauge. The strain gauge may be configured to measure pressure, torque, or stress using the piezoelectric effect. The piezoelectric effect refers to a phenomenon in which electrical resistance of a metal or semiconductor resistor is changed when the resistor is deformed.

The alignment marks ALM described with reference to FIGS. 11A and 11B may be used to dispose the pressure-sensing unit FSP below the supporting layer MP.

Figure 14:
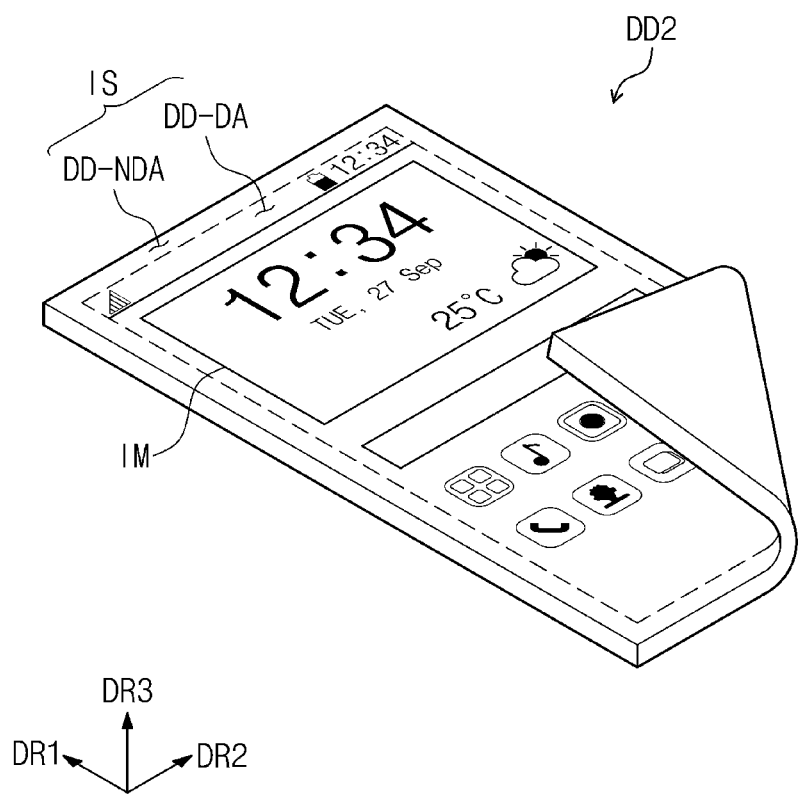
FIG. 14 and FIG. 15 are perspective views illustrating display devices according to exemplary embodiments.
Figure 15:
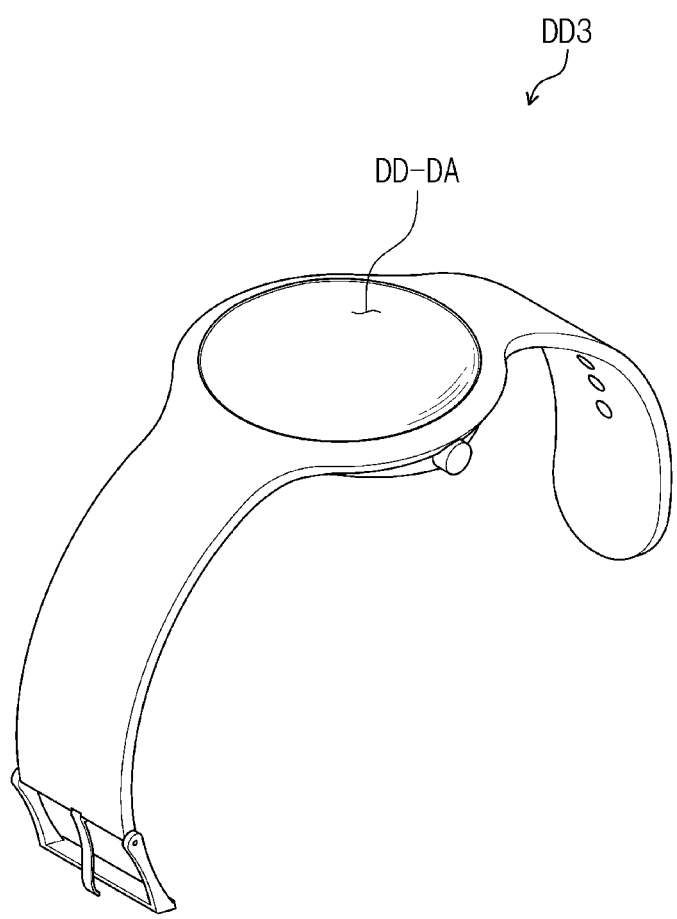

FIG. 14 is a perspective view illustrating a display device DD2 according to an exemplary embodiment. FIG. 15 is a perspective view illustrating a display device DD3 according to an exemplary embodiment.

Referring to FIG. 14, a portion or the entirety of the display device DD2 may be bent or rolled.

Referring to FIG. 15, the display device DD3 may be a wearable device that can be worn on the human body. In FIG. 15, a clock-type device is illustrated as an example of the display device DD3, but the inventive concepts are not limited thereto. A shape of the display device DD3 may be variously changed to be worn on the human body.

According to the exemplary embodiments of the inventive concept, a display device is configured to have good durability, and thus, internal elements of the display device may be prevented from being broken by an external impact.

In addition, the display device may be configured to effectively exhaust heat produced from internal elements thereof to the outside. In this manner, a spatial variation in brightness of the display device, which may be caused by a spatial variation in temperature of a display panel, may be reduced.

Furthermore, the display device may be configured to provide an excellent aesthetic appearance even in its turn-off state.

Although some exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a display panel, in which a display region comprising a plurality of organic light emitting devices and a non-display region adjacent to the display region are defined;
a protection film disposed below the display panel;
a first adhesive layer contacting a bottom surface of the protection film;
a supporting layer comprising a metallic material, at least overlapping the entire display region, and contacting the first adhesive layer;
an input-sensing unit disposed on the display panel;
an anti-reflection unit disposed on the input-sensing unit; and
a window panel disposed on the input-sensing unit.

2. The display device of claim 1, wherein the first adhesive layer comprises a pressure sensitive adhesive.

3. The display device of claim 2, wherein the first adhesive layer has a black color.

4. The display device of claim 1, wherein:
the protection film comprises a plurality of alignment marks on a bottom portion thereof; and
the supporting layer exposes the alignment marks.

5. The display device of claim 4, wherein:
the supporting layer has a recessed region formed in one side thereof in a plan view; and
the recessed region exposes the alignment marks.

6. The display device of claim 1, wherein a width of the supporting layer is greater than a width of the display panel.

7. The display device of claim 1, wherein the metallic material comprises at least one of stainless steel, aluminum, iron, and copper.

8. The display device of claim 1, wherein the supporting layer comprises graphite.

9. The display device of claim 1, wherein the supporting layer further comprises a plating layer having a black color and contacting the first adhesive layer.

10. The display device of claim 9, wherein the plating layer comprises nickel (Ni).

11. The display device of claim 1, wherein:
an upward direction, a downward direction, a leftward direction, and a rightward direction are defined on a plane parallel to the display region;
in the rightward direction and the leftward direction, the anti-reflection unit protrudes outwardly from the supporting layer;
in the upward direction, the anti-reflection unit protrudes outwardly from the supporting layer; and
in the downward direction, the supporting layer protrudes outwardly from the anti-reflection unit.

12. The display device of claim 11, wherein the display panel further comprises a plurality of pads disposed in the downward direction and configured to provide electrical signals to the organic light emitting devices.

* * * * *